(12) United States Patent
Lai et al.

(10) Patent No.: US 11,502,105 B2
(45) Date of Patent: Nov. 15, 2022

(54) SEMICONDUCTOR STRUCTURE AND A METHOD FOR MANUFACTURING THE SAME

(71) Applicant: MACRONIX INTERNATIONAL CO., LTD., Hsinchu (TW)

(72) Inventors: Erh-Kun Lai, Taichung (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 1 day.

(21) Appl. No.: 17/223,050

(22) Filed: Apr. 6, 2021

(65) Prior Publication Data

US 2022/0320140 A1 Oct. 6, 2022

(51) Int. Cl.
| | |
|---|---|
| *H01L 29/06* | (2006.01) |
| *H01L 27/1159* | (2017.01) |
| *H01L 21/28* | (2006.01) |
| *H01L 27/11597* | (2017.01) |
| *H01L 29/45* | (2006.01) |
| *H01L 21/764* | (2006.01) |
| *H01L 21/285* | (2006.01) |

(52) U.S. Cl.
CPC .. *H01L 27/11597* (2013.01); *H01L 21/28518* (2013.01); *H01L 21/764* (2013.01); *H01L 27/1159* (2013.01); *H01L 29/0649* (2013.01); *H01L 29/45* (2013.01)

(58) Field of Classification Search
CPC ............. H01L 29/0649; H01L 29/45; H01L 27/11597; H01L 27/1159; H01L 21/764; H01L 21/28518

USPC .......................................................... 257/295
See application file for complete search history.

(56) References Cited

U.S. PATENT DOCUMENTS 9,401,371 B1 * 7/2016 Lee .................. H01L 27/11565
9,853,049 B2 12/2017 Kim et al.
(Continued)

FOREIGN PATENT DOCUMENTS

| CN | 107305895 A | 10/2017 |
|---|---|---|
| CN | 108682676 A | 10/2018 |

(Continued)

OTHER PUBLICATIONS

Miyagawa, et al.: "Metal-Assisted Solid-Phase Crystallization Process for Vertical Monocrystalline Si Channel in 3D Flash Memory"; 978-1-7281-4032-2/19/$31.00 © 2019 IEEE; pp. 28.3.1-28.3.4.
(Continued)

*Primary Examiner* — Monica D Harrison
(74) *Attorney, Agent, or Firm* — McClure, Qualey & Rodack, LLP

(57) ABSTRACT

A semiconductor structure and a method for manufacturing the same are provided. The method includes: forming a silicide layer, forming a vertical Si channel layer, wherein the vertical Si channel layer is on an upper surface of the silicide layer, the vertical Si channel layer has a first silicon phase; performing a first annealing step so as to move the silicide layer upward and change a solid phase of the vertical Si channel layer from the first silicon phase to a second silicon phase at an interface of the silicide layer and the vertical Si channel layer, wherein the second silicon phase has a conductivity higher than a conductivity of the first silicon phase.

18 Claims, 15 Drawing Sheets

(56) References Cited

U.S. PATENT DOCUMENTS

| | | | |
|---|---|---|---|
| 10,367,054 | B2 | 7/2019 | Miyagawa et al. |
| 10,515,810 | B2 * | 12/2019 | Lai .................... H01L 21/28518 |
| 10,896,914 | B2 | 1/2021 | Tachikawa et al. |
| 2007/0170541 | A1 | 7/2007 | Chui et al. |
| 2022/0149184 | A1 * | 5/2022 | Hekmatshoartabari ...................... H01L 29/7827 |

FOREIGN PATENT DOCUMENTS

| | | |
|---|---|---|
| TW | 200903782 A | 1/2009 |
| TW | 201836070 A | 10/2018 |
| TW | 201939727 A | 10/2019 |

OTHER PUBLICATIONS

Parat, et al.: "Scaling Trends in NAND Flash"; 978-1-7281-1987-8/18/$31.00 © 2018 IEEE; pp. 2.1.1-2.1.4.

* cited by examiner

SEMICONDUCTOR STRUCTURE AND A METHOD FOR MANUFACTURING THE SAME

BACKGROUND

Technical Field

The disclosure relates to a semiconductor structure and a method for manufacturing the same, and more particularly to a semiconductor structure including single-crystal-like silicon and a method for manufacturing the same.

Description of the Related Art

Owing to increasing integration of semiconductor structures, the critical dimension of the semiconductor structures needs to be decreased. As such, complexity of the manufacturing process for semiconductor structures is raised, and electrical performance of the semiconductor structures is significantly affected. Currently, researches are directed to semiconductor structures with the reduced size and improved electrical performance.

It is desirable to provide technology for a semiconductor structure with an improved electrical performance.

SUMMARY

The present disclosure relates to a semiconductor structure and a method for manufacturing the same.

According to an embodiment of the present disclosure, a method for manufacturing a semiconductor structure is provided. The method includes the following steps. Forming a silicide layer. Forming a vertical Si channel layer, wherein the vertical Si channel layer is on an upper surface of the silicide layer, the vertical Si channel layer has a first silicon phase. Performing a first annealing step so as to move the silicide layer upward and change a solid phase of the vertical Si channel layer from the first silicon phase to a second silicon phase at an interface of the silicide layer and the vertical Si channel layer, wherein the second silicon phase has a conductivity higher than a conductivity of the first silicon phase.

According to an embodiment of the present disclosure, a semiconductor structure is provided. The semiconductor structure includes a lower silicide element, an upper silicide element and a vertical Si channel structure connected between the lower silicide element and the upper silicide element. The vertical Si channel layer includes single-crystal-like silicon.

The above and other embodiments of the disclosure will become better understood with regard to the following detailed description of the non-limiting embodiment(s). The following description is made with reference to the accompanying drawings.

DETAILED DESCRIPTION

Figure 1:
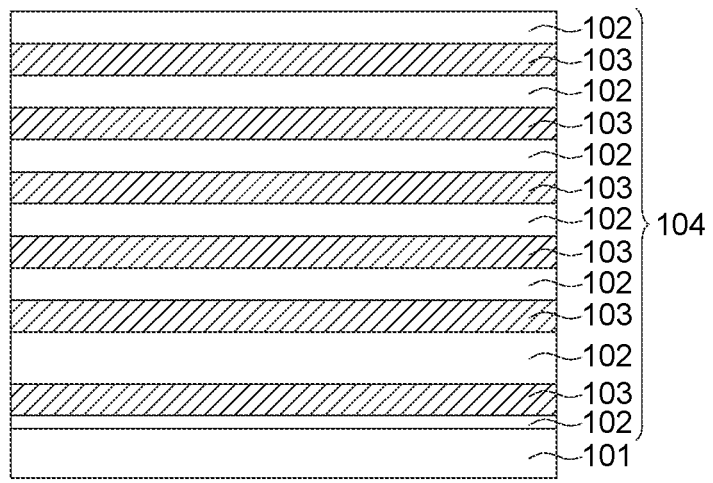
FIGS. 1-12 schematically illustrate a method for manufacturing a semiconductor structure according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

The embodiments of the present disclosure could be implemented in many different 3D stacked semiconductor structures in the applications. For example, the embodiment could be applied to, but not limited to, the 3D vertical-channel (VC) NAND memory devices.

FIGS. 1-12 schematically illustrate a method for manufacturing a semiconductor structure according to an embodiment of the present disclosure.

Referring to FIG. 1, a substrate 101 is provided. A stack structure 104 is formed over the substrate 101. The stack structure 104 may include a plurality of first insulating layers 102 and a plurality of second insulating layers 103 stacked alternately on the substrate 101, for example, along a direction D1. The direction D1 may be a normal direction to an upper surface of the substrate 101. The first insulating layers 102 are separated from each other by the second insulating layers 103. The substrate 101 may include doped or undoped semiconductor material, such as P-type silicon (Si). The present disclosure is not limited thereto. In another embodiment, the substrate 101 may use other materials such as a dielectric material or a conductive material. The first insulating layer 102 may include insulating materials comprising an oxide, such as silicon oxide. The second insulating layers 103 may include insulating materials comprising a nitride, such as silicon nitride. The first insulating layer 102 at the top of the stack structure 104 may be functioned as a hard mask. In an embodiment, the first insulating layer 102 and the second insulating layer 103 include different materials. In an embodiment, the stack structure 104 may be formed by depositing the first insulating layers 102 and second insulating layers 103 sequentially.

Figure 2:
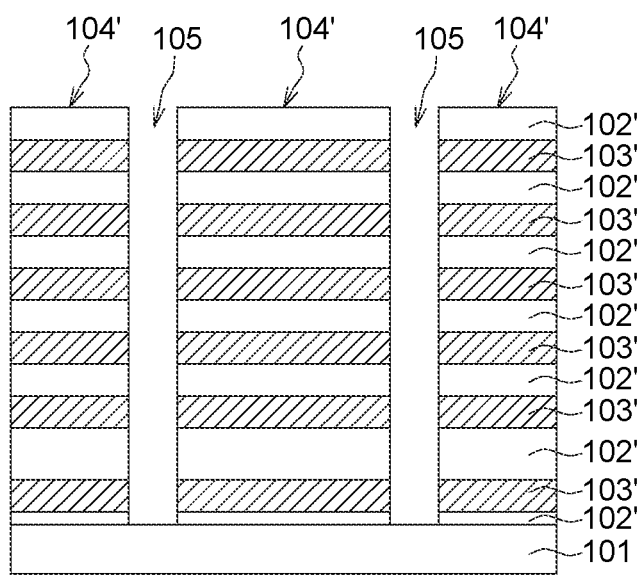

Referring to FIG. 2, the stack structure 104 is patterned, for example, the stack structure 104 may be patterned by a photolithography process, to form holes 105 and patterned stack structure 104' above the substrate 101. The patterned stack structure 104' includes first patterned insulating layers 102' and second patterned insulating layers 103' stacked alternately on the substrate 101 along the direction D1. The holes 105 are spaced apart from each other. The holes 105 extend downwardly in the D1 direction and stop on the substrate 101. The holes 105 expose sidewalls of the patterned stack structure 104' serving as the sidewalls of the holes 105 and a portion of the upper surface of the substrate 101 serving as the bottoms of the holes 105.

Figure 3:
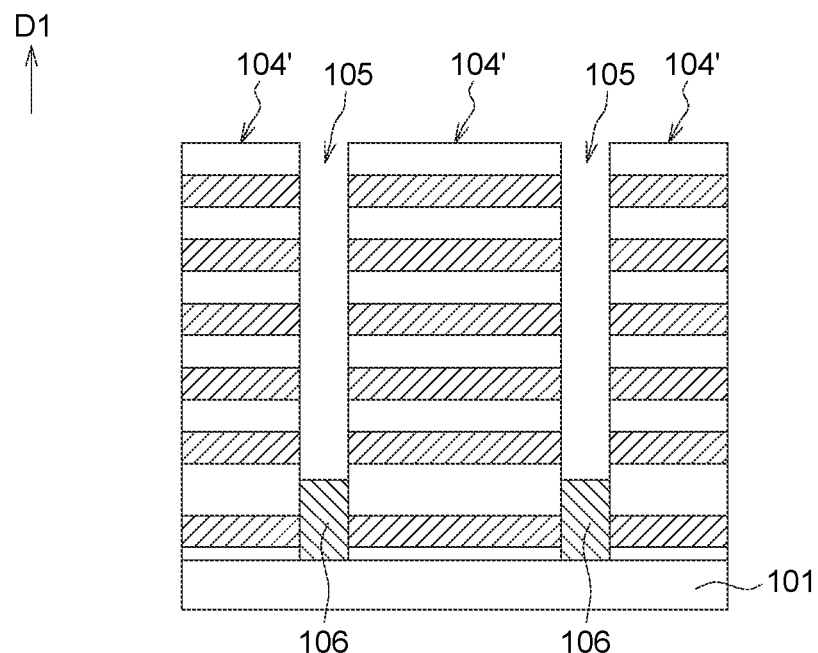

Referring to FIG. 3, semiconductor elements 106 are formed in the holes 105 respectively, for example, semiconductor elements 106 may be formed by a selective deposition process. In an embodiment, the semiconductor elements 106 may be an undoped or doped polysilicon layer formed by a selective epitaxial growth (SEG) process.

Figure 4:
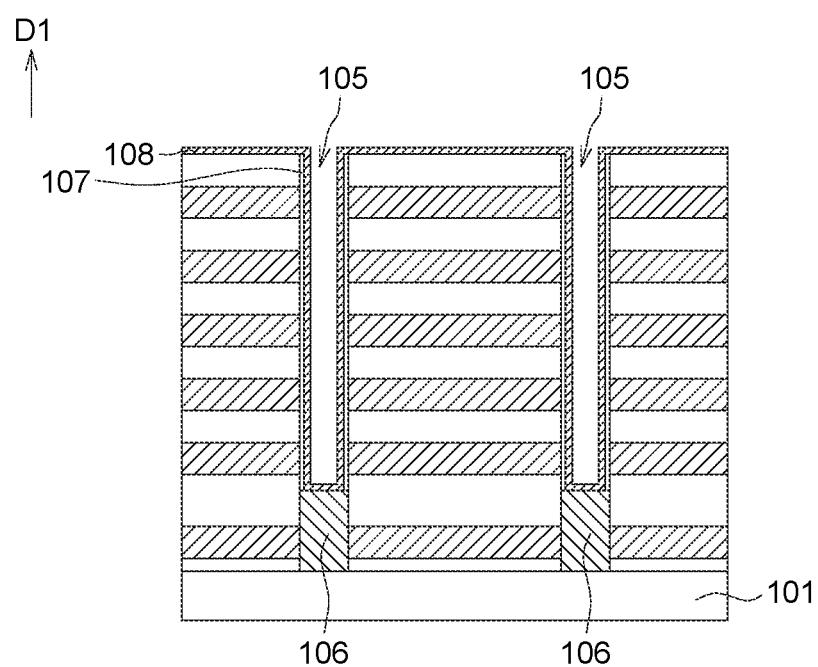

Afterward, as shown in FIG. 4, a memory film 107 and a vertical Si channel film 108 are formed in sequence to line the holes 105. Specifically, the memory film 107 is formed on sidewalls of the holes 105 and exposing a portion of the upper surfaces of the semiconductor elements 106; the vertical Si channel film 108 are then formed over the patterned stack structure 104', on sidewalls of the memory film 107 and on the semiconductor elements 106. The memory film 107 is disposed between the vertical Si channel film 108 and the sidewalls of the holes 105. In an embodiment, the vertical Si channel film 108 may be in contact with the upper surfaces of the semiconductor elements 106. In an embodiment, the memory film 107 is formed by a deposition process. The memory film 107 may include a multilayer structure known from memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), MA BE-SONOS (metal-high-k bandgap-engineered silicon-oxide-nitride-oxide-silicon), and combinations of those layers. The memory film 107 may have a tubular shape. The vertical Si channel film 108 may include undoped silicon having a solid phase of amorphous silicon phase (i.e. non-crystalline silicon phase) or polysilicon phase. In an embodiment, the memory film 107 may include a ferroelectric memory element and the semiconductor structure may be functioned as a ferroelectric random access memory (FRAM). For example, the memory film 107 may include doped $HfO_x$ storage materials. The doped $HfO_x$ storage materials may be doped by Si, Al, $ZrO_x$, Y, Gd, La and so on.

Figure 5:
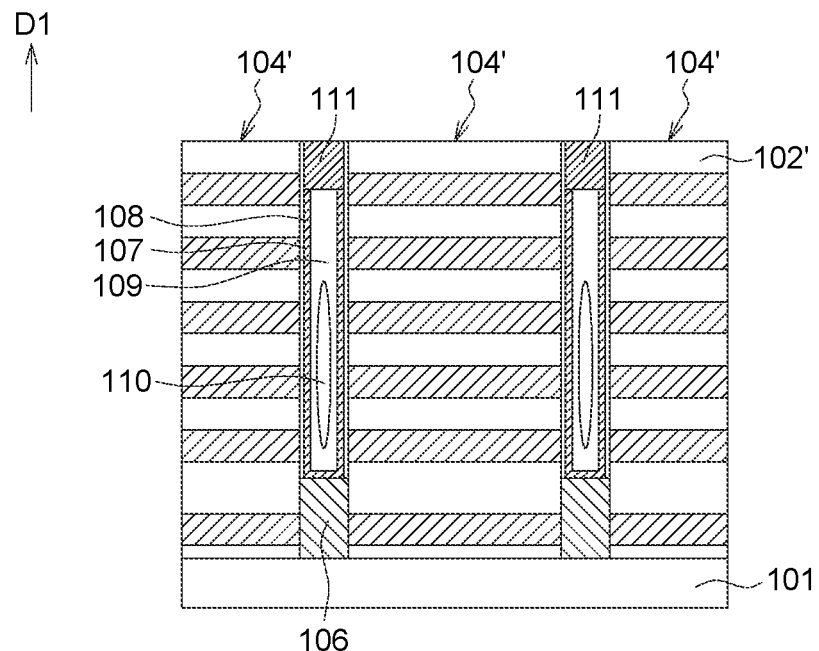

Referring to FIG. 5, a dielectric medium layer 109 is formed on the patterned stack structure 104' for covering the vertical Si channel film 108 and filling up the rest spaces inside the holes 105, for example, the dielectric medium layer 109 may be formed by a deposition process. In an embodiment, the dielectric medium layer 109 is formed with an air gap 110. The air gap 110 may be surrounded by the dielectric medium layer 109. In an embodiment, the dielectric medium layer 109 may include insulating materials comprising an oxide, such as silicon oxide. Then, the vertical Si channel film 108 and the dielectric medium layer 109 are recessed downwardly to expose the upper surfaces of the patterned stack structure 104' and a portion of the sidewall of the memory film 107. In one embodiment, the vertical Si channel film 108 and the dielectric medium layer 109 are recessed by an etching back process and/or a chemical-mechanical planarization (CMP).

Next, initial pads 111 are formed on the dielectric medium layer 109 and on the vertical Si channel film 108. In an embodiment, a deposition process and a chemical-mechanical planarization is performed in sequence to form the initial pads 111. The chemical-mechanical planarization for forming the initial pads 111 may be stopped on the first patterned insulating layer 102' at the top of the patterned stack structure 104'. The initial pads 111 may include silicon having a solid phase of amorphous silicon phase (i.e. non-crystalline silicon phase) or polysilicon phase. In an embodiment, the initial pad 111 and the vertical Si channel film 108 may include the same material.

Figure 6:
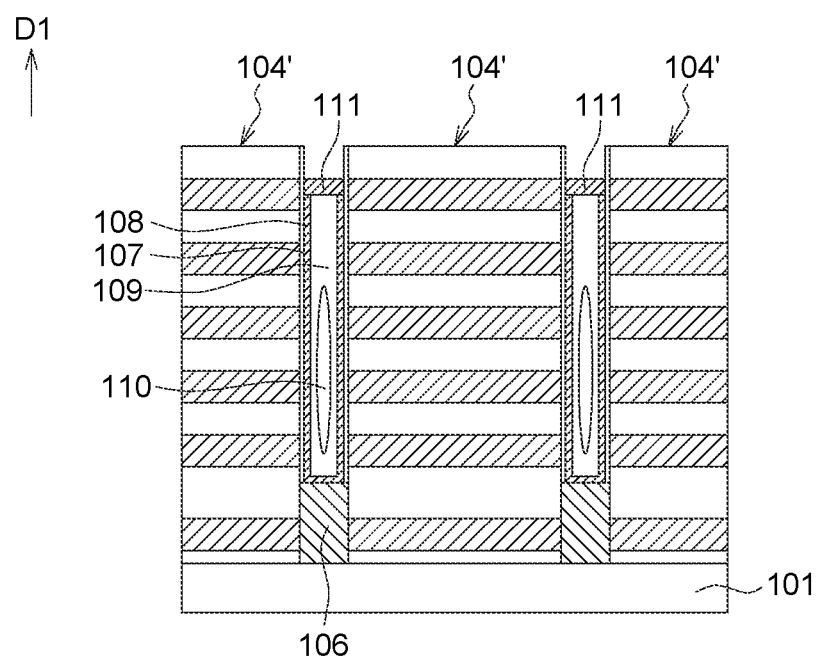

Afterward, as shown in FIG. 6, the initial pads 111 are recessed so as to expose a portion of the sidewall of the memory film 107. For example, the initial pads 111 may be recessed by a chemical-mechanical planarization.

Figure 7:
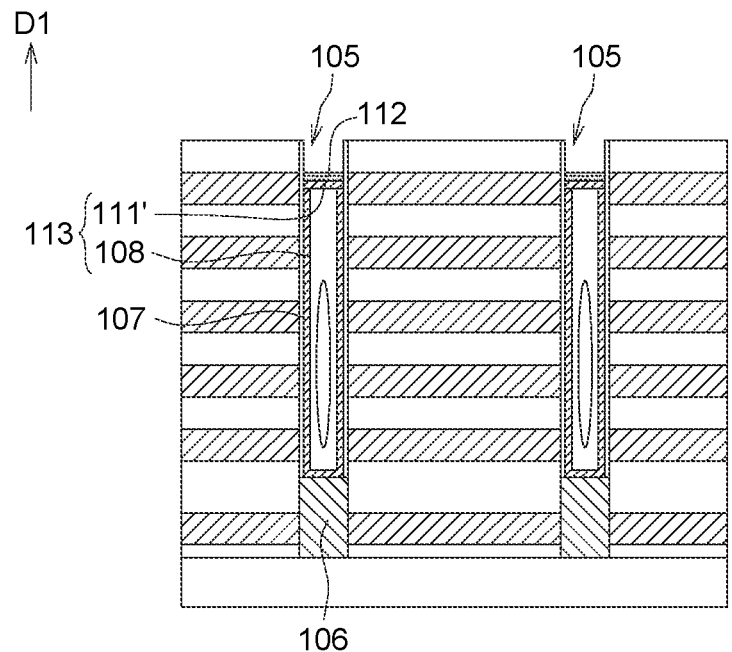

Referring to FIG. 7, silicide layers 112 are formed on pads 111' respectively. The silicide layer 112 may include mono-silicon silicide, such as cobalt silicide (CoSi) or nickel silicide (NiSi). The silicide layer 112 may be referred to as a metal silicide layer. The silicide layers 112 may be formed by the following steps: a deposition process is performed to form a Co or Ni layer (not shown) over the initial pads 111, and the Co or Ni layer is functioned as a precursor; an annealing step is performed to the semiconductor structure. During the annealing step, a portion of the initial pads 111 reacts with the Co or Ni layer to form the silicide layers 112, and the remained initial pads 111 (or may be understood as the unreacted portion of the initial pads 111) are defined as the pads 111'. In an embodiment, the Co or Ni layer may not completely react to form the silicide layers 112, and the unreacted Co or Ni layer is removed by a cleaning step using SPM or SC1 chemistries. In the step shown in FIG. 7, first vertical Si channel layers 113 are formed in the holes 105 respectively and between the silicide layers 112 and the semiconductor elements 106. Each of the first vertical Si channel layers 113 includes the vertical Si channel film 108 and the pad 111'. The silicide layer 112 is formed on an upper surface of the first vertical Si channel layer 113. For example, the annealing step may be performed at a temperature of about 400-600° C. (preferably under 600° C.) for about 30-90 seconds.

Figure 8:
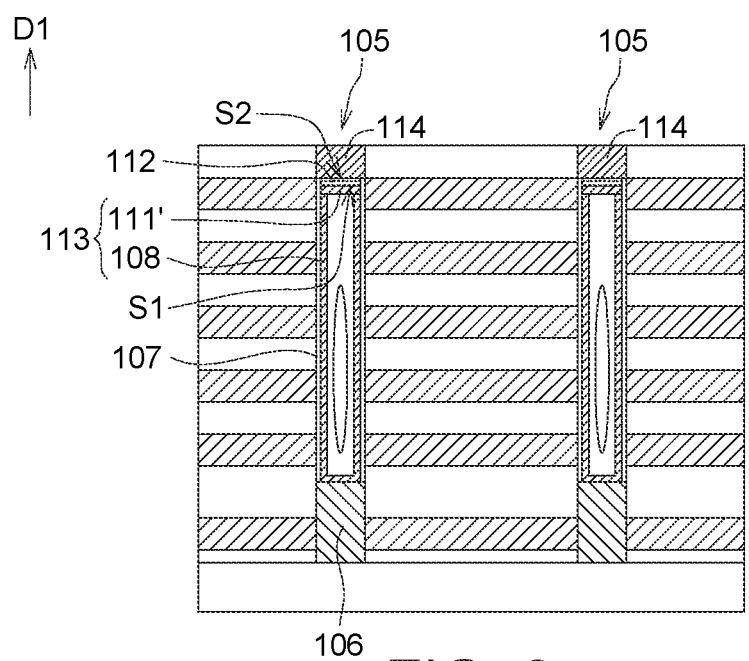

After forming the silicide layers 112, second vertical Si channel layers 114 are formed on upper surfaces of the silicide layers 112 respectively to fill up the holes 105, as shown in FIG. 8. In an embodiment, a deposition process and a chemical-mechanical planarization is performed in sequence to form the second vertical Si channel layers 114. The second vertical Si channel layers 114 may include silicon having a solid phase of amorphous silicon phase (i.e. non-crystalline silicon phase) or polysilicon phase. In an embodiment, second vertical Si channel layers 114 and the vertical Si channel film 108 may include the same material.

Figure 9:
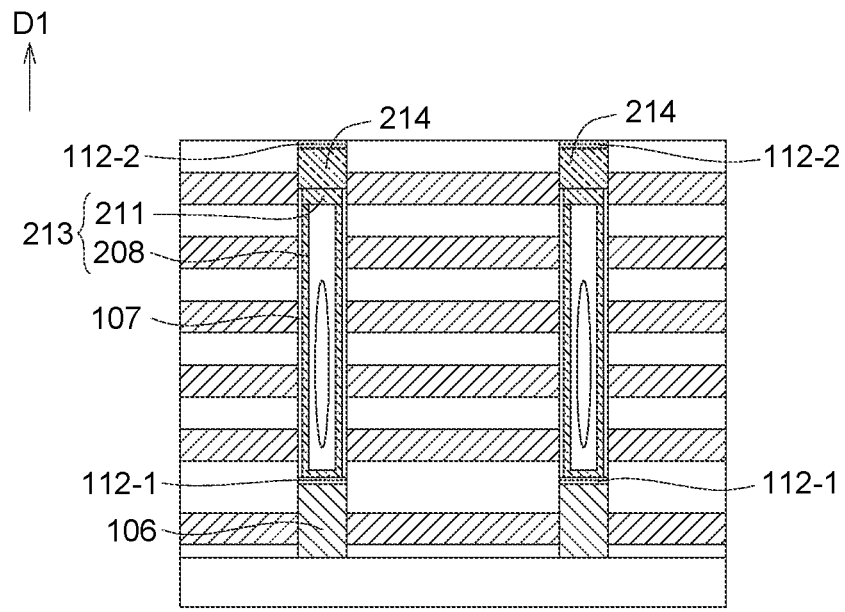
Figure 9A:
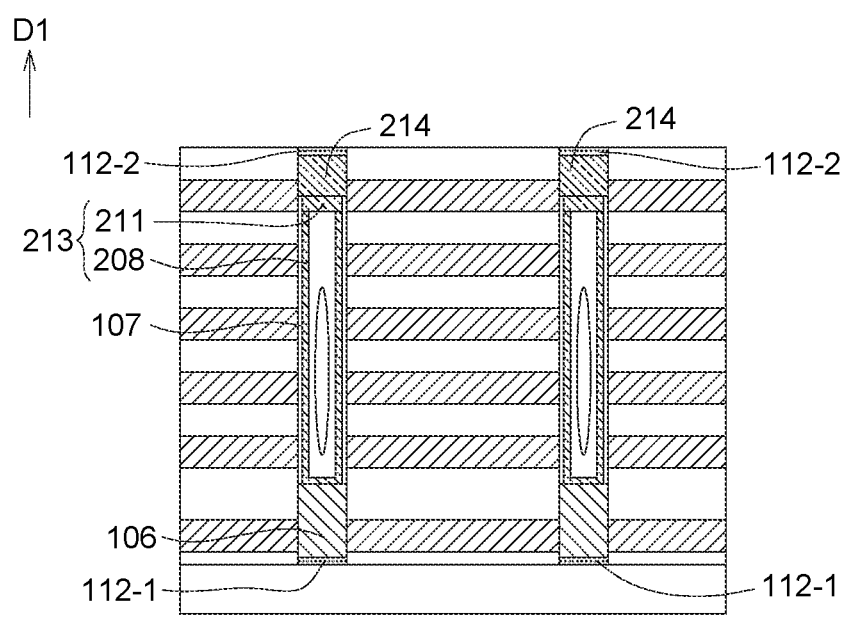

An annealing step is performed to the semiconductor structure shown in FIG. 8 to change the vertical Si channel films 108, the pads 111' and the second vertical Si channel layers 114 having a solid phase of a first silicon phase respectively into the vertical Si channel films 208, the pads 211 and the second vertical Si channel layers 214 having a solid phase of a second silicon phase as shown in FIG. 9. The vertical Si channel films 208, the pads 211 and the second vertical Si channel layers 214 having the second silicon phase have a conductivity higher than a conductivity of the vertical Si channel films 108, the pads 111' and the second vertical Si channel layers 114 having the first silicon phase. The first silicon phase of the vertical Si channel films 108, the pads 111' and the second vertical Si channel layers 114 comprise amorphous silicon phase (i.e. non-crystalline silicon phase) or polysilicon phase. In other words, the materials of the vertical Si channel films 108, the pads 111' and the second vertical Si channel layers 114 individually comprise amorphous silicon or polysilicon or individually are amorphous silicon or polysilicon. The second silicon phase of the vertical Si channel films 208, the pads 211 and the second vertical Si channel layers 214 comprise single-crystal-like silicon phase or single-crystal silicon phase. In other words, materials of the vertical Si channel films 208, the pads 211 and the second vertical Si channel layers 214 individually comprise single-crystal-like silicon or single-crystal silicon or individually are amorphous silicon or polysilicon. The solid phase change reaction may occur at an interface S1 of the silicide layer 112 and the first vertical Si channel layer 113 and at an interface S2 of the silicide layer 112 and the second vertical Si channel layer 114 caused by the annealing step. During the annealing step, the silicide layer 112 is divided into a first silicide element 112-1 and a second silicide element 112-2, the first silicide element 112-1 (or the interface S1) moves downward, and the second silicide element 112-2 (or the interface S2) moves upward. The solid phase change reaction may occur from portions of the first vertical Si channel layer 113 and the second vertical Si channel layer 114 close to the silicide layer 112 toward portions of the first vertical Si channel layer 113 and the second vertical Si channel layer 114 far away from the silicide layer 112. The first silicide element 112-1 and the second silicide element 112-2 may include mono-silicon silicide, such as CoSi or NiSi. The first silicide element 112-1 and the second silicide element 112-2 may be referred to as metal silicide layers. The first silicide element 112-1 stops moving on the semiconductor element 106. For example, the annealing step may be performed at a temperature of about 450-550° C. for several hours. In an embodiment, the first silicide element 112-1 stops moving on the substrate 101 (as shown in FIG. 9A) if the semiconductor element 106 is formed by a selective deposition process. In another embodiment, the first silicide element 112-1 stops moving on the semiconductor element 106 (as shown in FIG. 9) if the semiconductor element 106 includes polysilicon.

The single-crystal-like silicon phase may mean that the most portion of the solid phase of the vertical Si channel films 208, the pads 211 and the second vertical Si channel layers 214 is single-crystal and the solid phase of the vertical Si channel films 208, the pads 211 and the second vertical Si channel layers 214 include a small portion of amorphous silicon and/or polysilicon which is not completely transformed to single-crystal. In an embodiment, in the single-crystal-like silicon phase, the crystal lattice of a portion of the single-crystal-like silicon solid may fit the definition of the crystal lattice of the monocrystalline silicon solid. In an embodiment, the intra-grain defect density or grain boundary defect density of the single-crystal-like silicon phase may be between the defect density of the single crystal silicon phase and the defect density of the polysilicon phase (much closer to the defect density of the single crystal silicon phase), and the conductivity of the single-crystal-like silicon phase is much closer to the conductivity of the single crystal silicon phase which is higher than the conductivity of the polysilicon phase. Furthermore, the cell current during operation in the single-crystal-like silicon phase is larger than in the polysilicon phase.

Figure 10:
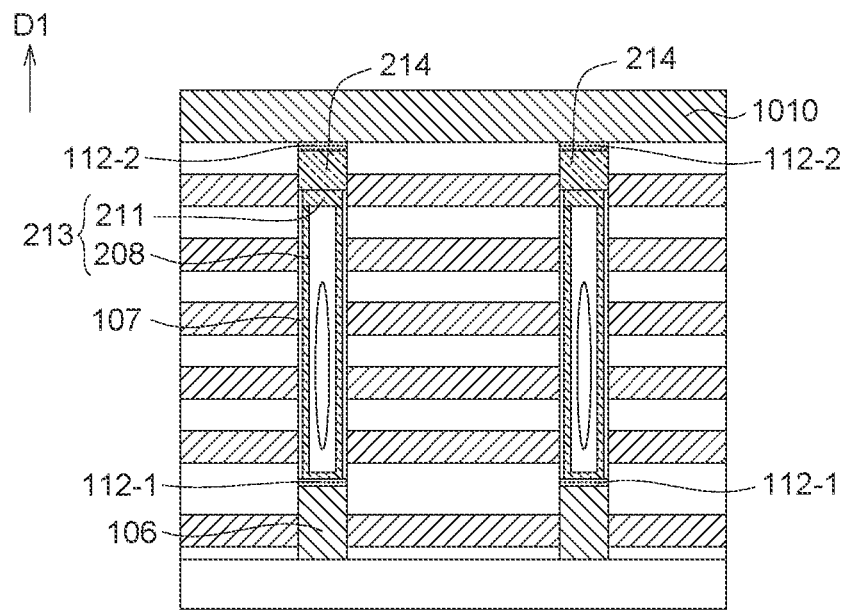
Figure 11:
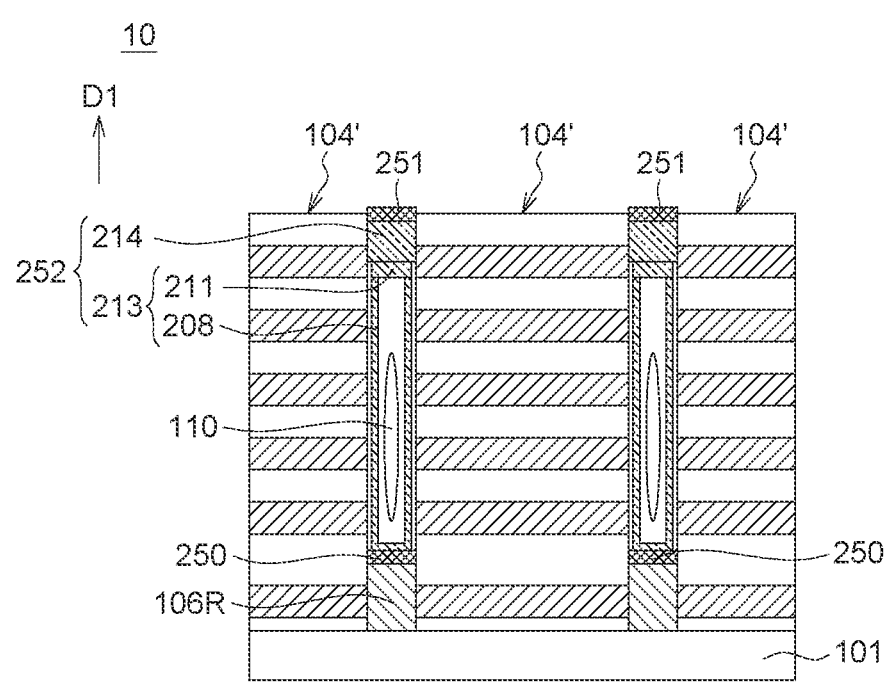

Next, a polysilicon layer 1010 is formed over the patterned stack structure 104' and on the second silicide element 112-2, and an annealing step is performed to the semiconductor structure shown in FIG. 10. During the annealing step, a reaction of the second silicide element 112-2 with the polysilicon layer 1010 to form an upper silicide element 251 occurs, a reaction of the first silicide element 112-1 with the semiconductor element 106 therebelow to form a lower silicide element 250 occurs as well, as shown in FIG. 11. For example, the annealing step may be performed at a temperature of about 600-800° C. for about 30-90 seconds.

After the annealing step, the remained polysilicon layer 1010 may be removed, and the remained semiconductor element 106 may be defined as semiconductor element 106R. The upper silicide element 251 includes a di-silicon silicide portion. The lower silicide element 250 includes a di-silicon silicide portion. For example, the di-silicon silicide portion may include $CoSi_2$ or $NiSi_2$. The di-silicon silicide portion may be referred to as a di-silicon metal silicide portion. The transformation of the first silicide element 112-1 to the lower silicide element 250 may improve the electrical performance since an electrical resistance of the di-silicon silicide portion of the lower silicide element 250 is smaller than an electrical resistance of the mono-silicon silicide of the first silicide element 112-1. Similarly, the transformation of the second silicide element 112-2 to the upper silicide element 251 may improve the electrical performance.

In an embodiment, a thickness of the upper silicide element 251 may be higher than a thickness of the second silicide element 112-2, which is conducive to contact landing. Similarly, a thickness of the lower silicide element 250 may be higher than a thickness of the first silicide element 112-1, which is conducive to contact landing.

Through the method schematically illustrated in FIGS. 1-11, a semiconductor structure 10 is provided. The semiconductor structure 10 includes the lower silicide element 250, the upper suicide element 251 and a vertical Si channel structure 252 connected (or adjoined, or in contact) between the lower silicide element 250 and the upper silicide element 251. The vertical Si channel structure 252 includes single-crystal-like silicon. The vertical Si channel structure 252 including the first vertical Si channel layer 213 and the second vertical Si channel layers 214 on the upper surface of the first vertical Si channel layer 213 and under the upper silicide element 251. The first vertical Si channel layer 213 includes the vertical Si channel film 208 having a solid phase of single-crystal-like silicon phase and the pad 211 having a solid phase of single-crystal-like silicon phase disposed on the vertical Si channel film 208. The second vertical Si channel layer 214 is between the first vertical Si channel layer 213 and the upper silicide element 251. In an embodiment, the upper silicide element 251 may be on top of the patterned stacked structure 104'.

The semiconductor structure 10 further includes the dielectric medium layer 109 and the air gap 110 surrounded by the dielectric medium layer 109. The vertical Si channel film 208 extends downwardly in the D1 direction and surrounds the dielectric medium layer 109 and the air gap 110. The semiconductor structure 10 further includes the semiconductor element 106R under the lower silicide element 250. The lower silicide element 250 is connected between (or adjoined, or in contact) the semiconductor element 106R and the vertical Si channel structure 252.

Figure 12:
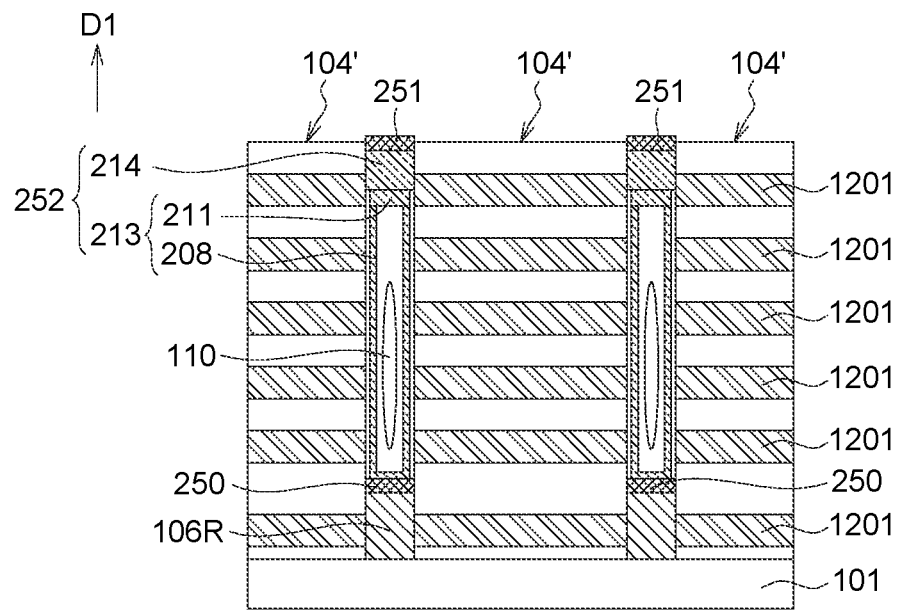

In an embodiment, after the method schematically illustrated in FIGS. 1-11, a gate replacement process may be performed to the semiconductor structure 10 so as to replace the second patterned insulating layers 103' with the conductive layers 1201, as shown in FIG. 12. The conductive layers 1201 may be functioned as a gate structure of the semiconductor structure. The conductive layers 1201 may include tungsten (W).

FIGS. 13-19 schematically illustrate a method for manufacturing a semiconductor structure according to another embodiment of the present disclosure. In an embodiment, the manufacturing steps illustrated with referring to FIGS. 13-19 may be performed after the manufacturing steps illustrated with referring to FIGS. 1-6.

Figure 13:
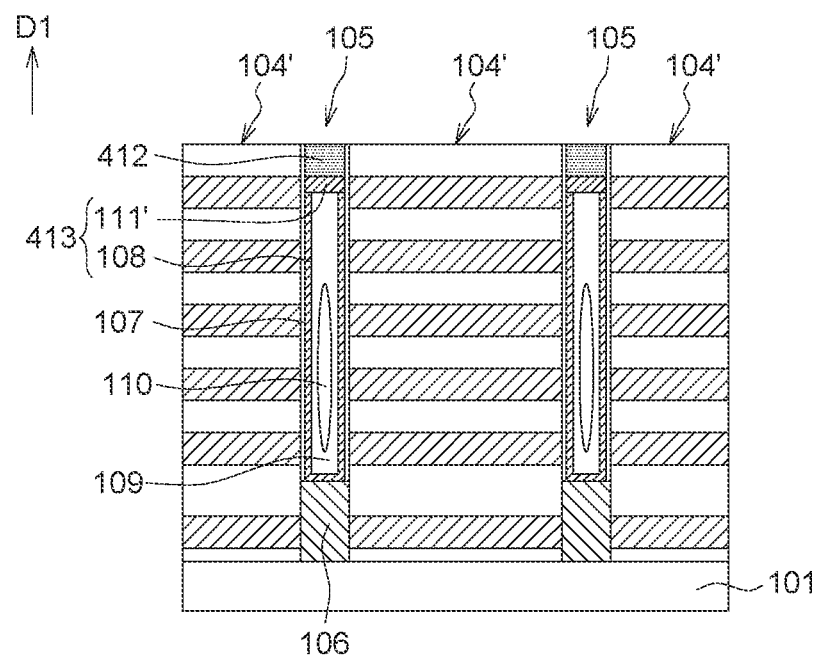
FIGS. 13-19 schematically illustrate a method for manufacturing a semiconductor structure according to another embodiment of the present disclosure.

Referring to FIG. 13, after the initial pads 111 are recessed, silicide layers 412 are formed on pads 111' respectively. For example, the initial pads 111 may be recessed by a chemical-mechanical planarization. The silicide layers 412 may fill up the rest spaces inside the holes 105. The silicide layers 412 may include mono-silicon silicide, such as CoSi or NiSi. The silicide layer 412 may be referred to as a metal silicide layer. The silicide layers 412 may be formed by the following steps: a deposition process is performed to form a Co or Ni layer (not shown) over the initial pads 111, and the Co or Ni layer is functioned as a precursor; an annealing step is then performed to the semiconductor structure. During the annealing step, a portion of the initial pads 111 reacts with the Co or Ni layer to form the silicide layers 412, and the remained initial pads 111 (or may be understood as the unreacted portion of the initial pads 111) are defined as the pads 111'. In an embodiment, the Co or Ni layer may not completely react to form the silicide layers 412, and the unreacted Co or Ni layer is removed by a cleaning step using SPM or SC1 chemistries. Each of the first vertical Si channel layers 413 includes the vertical Si channel film 108 and the pad 111'. The first vertical Si channel layer 413 is between silicide layers 412 and the semiconductor elements 106. The silicide layer 412 is formed on an upper surface of the first vertical Si channel layer 413. For example, the annealing step may be performed at a temperature of about 400-600° C. (preferably under 600° C.) for about 30-90 seconds.

Figure 14:
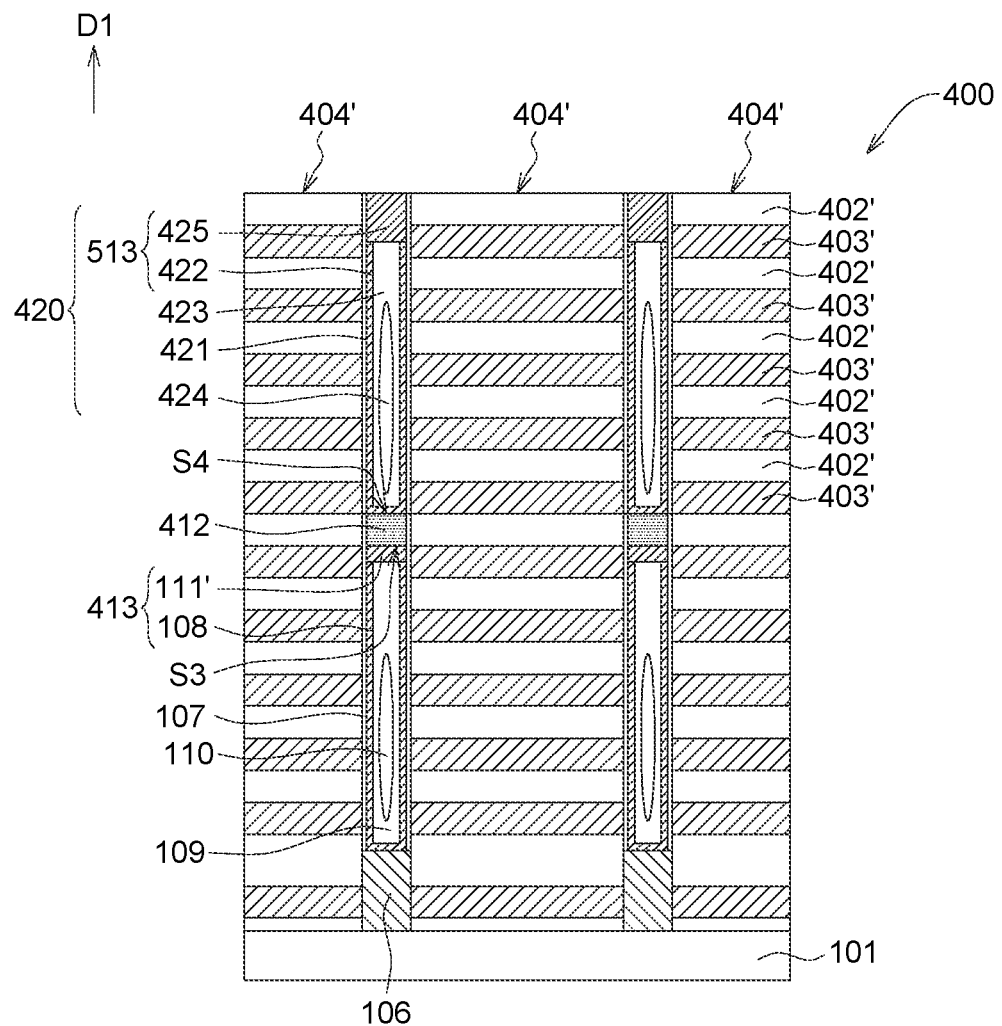

After forming the silicide layers 412, a semiconductor stack 400 is formed above the patterned stack structure 104' and the silicide layers 412, as shown in FIG. 14. The semiconductor stack 400 may include patterned stack structure 404' and channel pillars 420 spaced apart from each other. The patterned stack structure 404' may be aligned with the patterned stack structure 104' and the channel pillars 420 may be aligned with the silicide layers 412 so as to make the channel pillars 420 electrically connect to the first vertical Si channel layers 413.

The patterned stack structure 404' may include third pattered insulating layers 402' and fourth patterned insulating layers 403' stacked alternately along the direction D1. The third patterned insulating layers 402' may include insulating materials comprising an oxide, such as silicon oxide. The fourth patterned insulating layers 403' may include insulating materials comprising a nitride, such as silicon nitride. In an embodiment, the third patterned insulating layers 402' and the fourth patterned insulating layers 403' include different materials. In an embodiment, the patterned stack structure 404' may be formed by processes similar to the processes used to manufacture the patterned stack structure 104'.

Each of the channel pillar 420 may include a third vertical Si channel layer 513 including a vertical Si channel film 422 and a pad 425, a memory film 421 formed on an outer surface of the third vertical Si channel layer 513, a dielectric medium layer 423 formed between the vertical Si channel film 422 and the pad 425, and an air gap 424 formed in the dielectric medium layer 423. The pad 425 is formed on the dielectric medium layer 423 and the vertical Si channel film 422. In an embodiment, the vertical Si channel film 422 may be in contact with the upper surface of the silicide layer 412. The methods for forming the memory film 421, the vertical Si channel film 422, the dielectric medium layer 423, the air gap 424 and the pad 425 may be similar to the methods for forming the memory film 107, the vertical Si channel film 108, the dielectric medium layer 109, the air gap 110 and the initial pad 111 respectively.

In an embodiment, the memory film 421 may include a multilayer structure known from memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), MA BE-SONOS (metal-high-k bandgap-engineered silicon-oxide-nitride-oxide-silicon), and combinations of those layers. In an embodiment, the memory film 421 may include a ferroelectric memory element and the semiconductor structure may be functioned as a ferroelectric random access memory (FRAM). For example, the memory film 421 may include doped $HfO_x$ storage materials. The doped $HfO_x$ storage materials may be doped by Si, Al, $ZrO_x$, Y, Gd, La and so on. The memory film 421 may have a tubular shape. The vertical Si channel film 422 may include undoped silicon having a solid phase of amorphous silicon phase (i.e. non-crystalline silicon phase) or polysilicon phase. The dielectric medium layer 423 may include insulating materials comprising an oxide, such as silicon oxide. The pad 425 may include silicon having a solid phase of amorphous silicon phase (i.e. non-crystalline silicon phase) or polysilicon phase.

Figure 15:
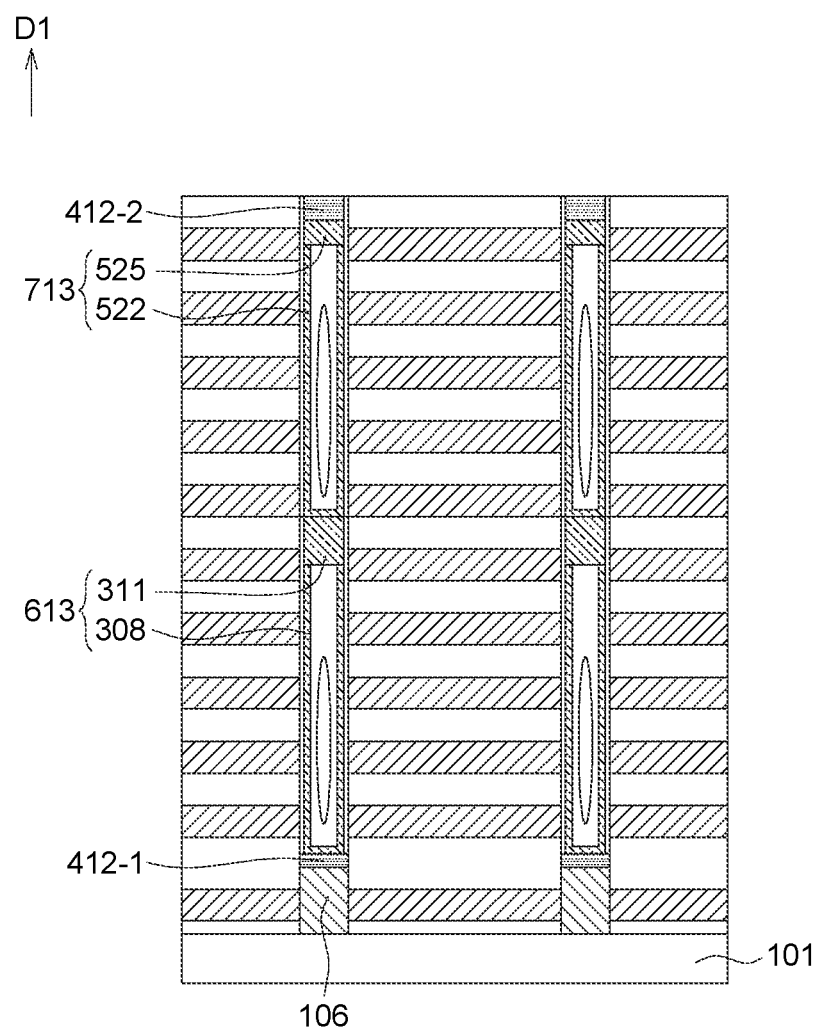

Then, an annealing step is performed to the semiconductor structure shown in FIG. 14 to change the vertical Si channel films 108, the pads 111', the vertical Si channel films 422 and the pads 425 having a solid phase of a first silicon phase respectively into the vertical Si channel films 308, the pads 311, the vertical Si channel films 522 and the pads 525 having a solid phase of a second silicon phase as shown in FIG. 15. The vertical Si channel films 308, the pads 311, the vertical Si channel films 522 and the pads 525 having the second silicon phase have a conductivity higher than a conductivity of the vertical Si channel films 108, the pads 111', the vertical Si channel films 422 and the pads 425 having the first silicon phase. The first silicon phase of the vertical Si channel films 108, the pads 111', the vertical Si channel films 422 and the pads 425 comprise amorphous silicon phase (i.e. non-crystalline silicon phase) or polysilicon phase. In other words, the materials of the vertical Si channel films 108, the pads 111', the vertical Si channel films 422 and the pads 425 individually comprise amorphous silicon or polysilicon. The second silicon phase of the vertical Si channel films 308, the pads 311, the vertical Si channel films 522 and the pads 525 comprise single-crystal-like silicon phase or single-crystal silicon phase. In other words, materials of the vertical Si channel films 308, the pads 311, the vertical Si channel films 522 and the pads 525 individually comprise single-crystal-like silicon or single-crystal silicon. The solid phase change reaction may occur at an interface S3 of the silicide layer 412 and the first vertical Si channel layer 413 and at an interface S4 of the silicide layer 412 and the third vertical Si channel layer 513 caused by the annealing step.

During the annealing step, the silicide layer 412 is divided into a first silicide element 412-1 and a second silicide element 412-2, the first silicide element 412-1 (or the interface S3) moves downward, and the second silicide element 412-2 (or the interface S4) moves upward. The solid phase change reaction may occur from portions of the first vertical Si channel layer 413 and the third vertical Si channel layer 513 close to the silicide layer 412 toward portions of the first vertical Si channel layer 413 and the third vertical Si channel layer 513 far away from the silicide layer 412. The first silicide element 412-1 stops moving on the semiconductor element 106. The second silicide element 412-2 stops moving on the top of the pad 425. The first silicide element 412-1 and the second silicide element 412-2 may include mono-silicon silicide, such as CoSi or NiSi. The first silicide element 412-1 and the second silicide element 412-2 may be referred to as metal silicide layers. For example, the annealing step may be performed at a temperature of about 450-550° C. for several hours.

Figure 15A:
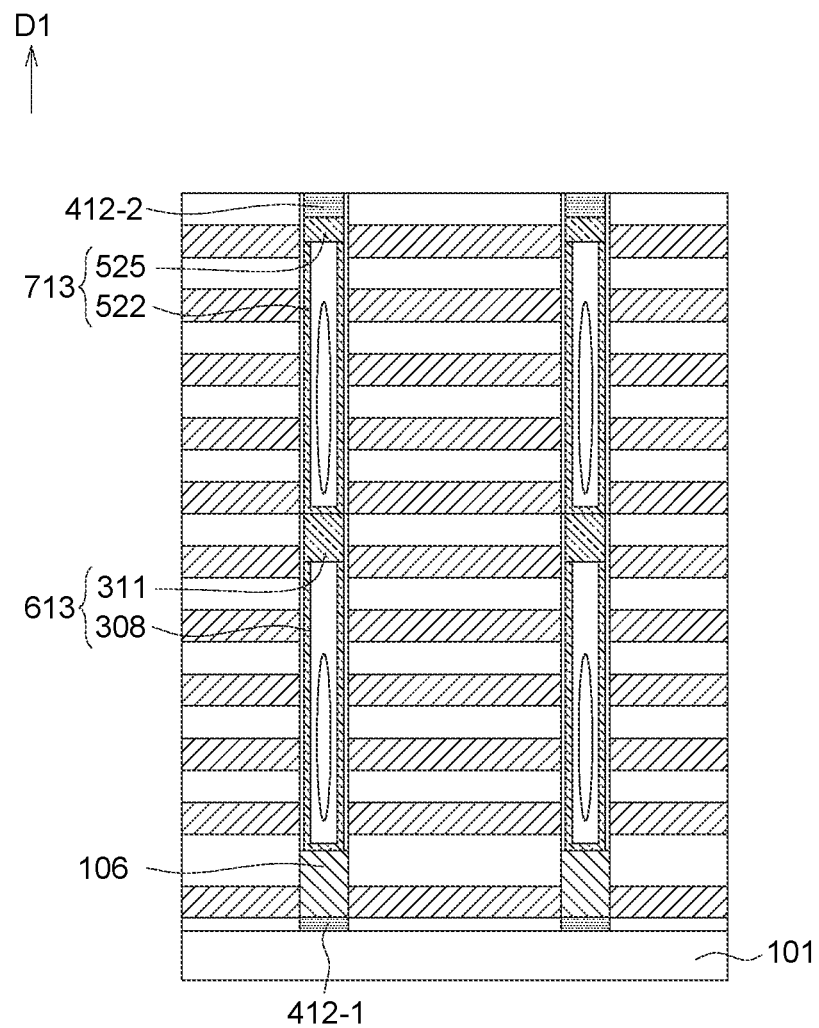

In an embodiment, the first silicide element 412-1 stops moving on the semiconductor element 106 (as shown in FIG. 15) if the semiconductor element 106 is formed by a selective deposition process. In another embodiment, the first silicide element 412-1 stops moving on the substrate 101 (as shown in FIG. 15A) if the semiconductor element 106 includes polysilicon.

Figure 16:
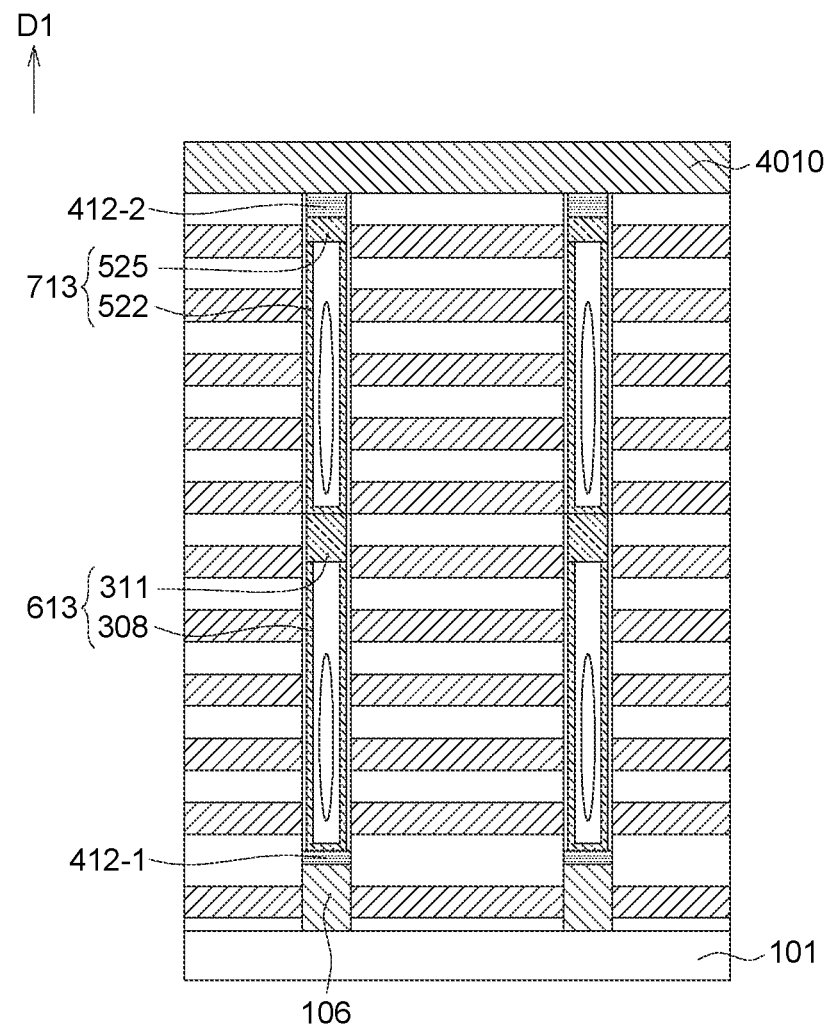
Figure 17:
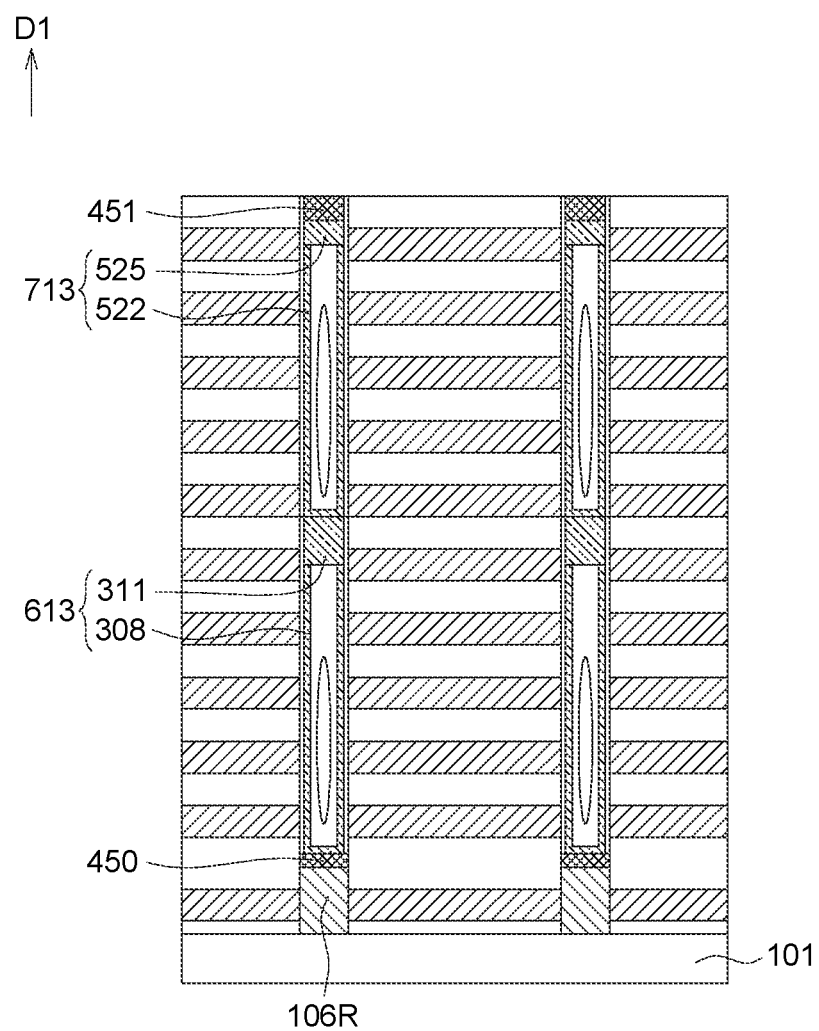

Afterward, a polysilicon layer 4010 is formed over the patterned stack structure 404' and on the second silicide element 412-2, and an annealing step is performed to the semiconductor structure shown in FIG. 16. During the annealing step, a reaction of the second silicide element 412-2 with the polysilicon layer 4010 to form an upper silicide element 451 occurs, a reaction of the first silicide element 412-1 with the semiconductor element 106 therebelow to form a lower silicide element 450 occurs as well, as shown in FIG. 17. For example, the annealing step may be performed at a temperature of about 600-800° C. for about 30-90 seconds.

After the annealing step, the remained polysilicon layer 4010 may be removed, and the remained semiconductor element 106 may be defined as semiconductor element 106R. The upper silicide element 451 includes a di-silicon silicide portion. The lower silicide element 450 includes a di-silicon silicide portion. For example, the di-silicon silicide portion may include $CoSi_2$ or $NiSi_2$. The di-silicon silicide portion may be referred to as a di-silicon metal silicide portion.

Figure 18:
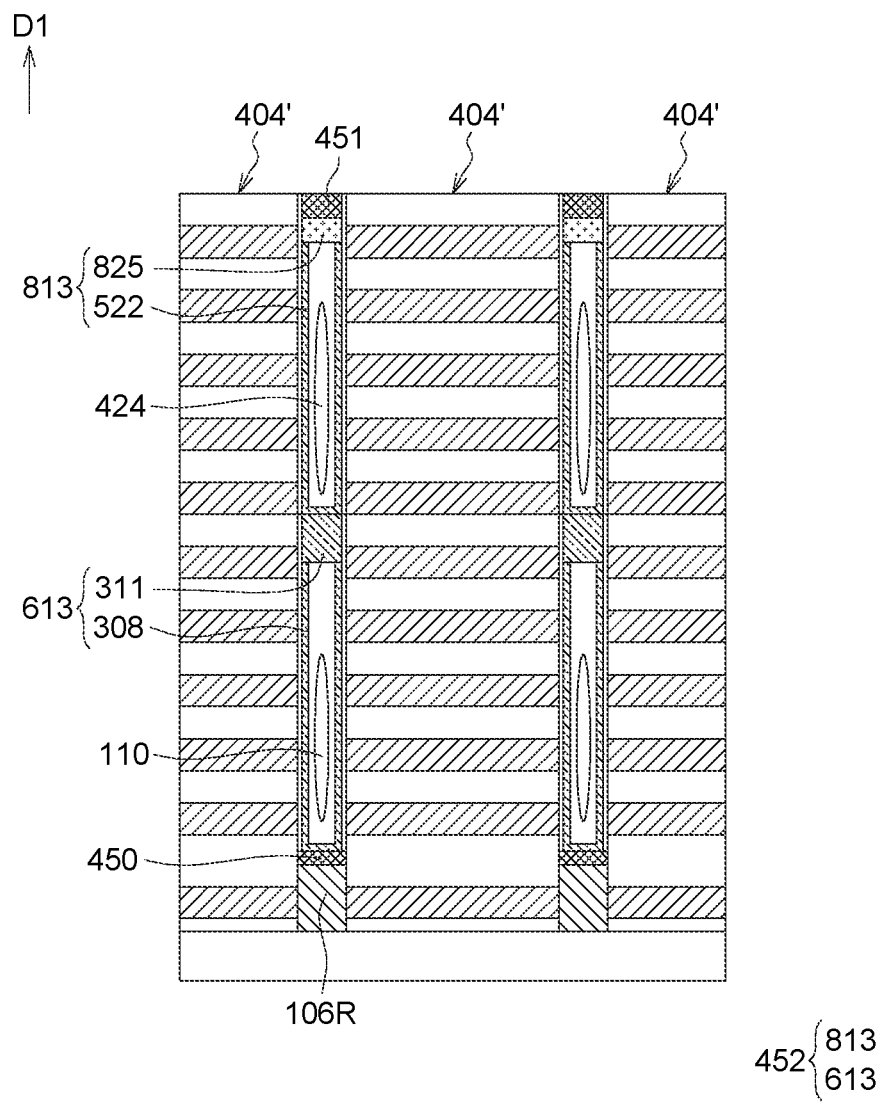

In an embodiment, an ion implantation process may be performed to the pads 525 to form implanted pads 825 under the upper silicide element 451, as shown in FIG. 18. The implanted pads 825 may include N-type semiconductor material, such as N-type silicon with single-crystal-like silicon phase. After the ion implantation process, the third vertical Si channel layer 813 including the implanted pad 825 and the vertical Si channel film 522 is formed.

Through the method schematically illustrated in FIGS. 13-18, a semiconductor structure 20 is provided. The semiconductor structure 20 includes the lower silicide element 450, the upper silicide element 451 and a vertical Si channel structure 452 connected between (or adjoined, or in contact) the lower silicide element 450 and the upper silicide element 251. The vertical Si channel structure 452 includes single-crystal-like silicon. The vertical Si channel structure 452 includes the third vertical Si channel layer 813 and the first vertical Si channel layer 613 under the third vertical Si channel layer 813. The third vertical Si channel layer 813 includes the vertical Si channel film 522 having a solid phase of single-crystal-like silicon phase and the implanted pad 825 disposed on the vertical Si channel film 522. In an embodiment, without performing the ion implantation process, the vertical Si channel structure 452 may include the third vertical Si channel layer 713 and the first vertical Si channel layer 613 under the third vertical Si channel layer 713, and the third vertical Si channel layer 713 includes the vertical Si channel film 522 having a solid phase of single-crystal-like silicon phase and the pad 525 disposed on the vertical Si channel film 522. The first vertical Si channel layer 613 includes the vertical Si channel film 308 having a solid phase of single-crystal-like silicon phase and the pad 311 having a solid phase of single-crystal-like silicon phase disposed on the vertical Si channel film 308. In an embodiment, the upper silicide element 451 is on top of the patterned stacked structure 404'.

The semiconductor structure 20 further includes a semiconductor element 106R under the lower silicide element 450. The lower silicide element 450 is connected between (or adjoined, or in contact) the semiconductor element 106 and the vertical Si channel structure 452. The semiconductor structure 20 further includes air gaps 110 and 424 in the vertical Si channel structure 452.

Figure 19:
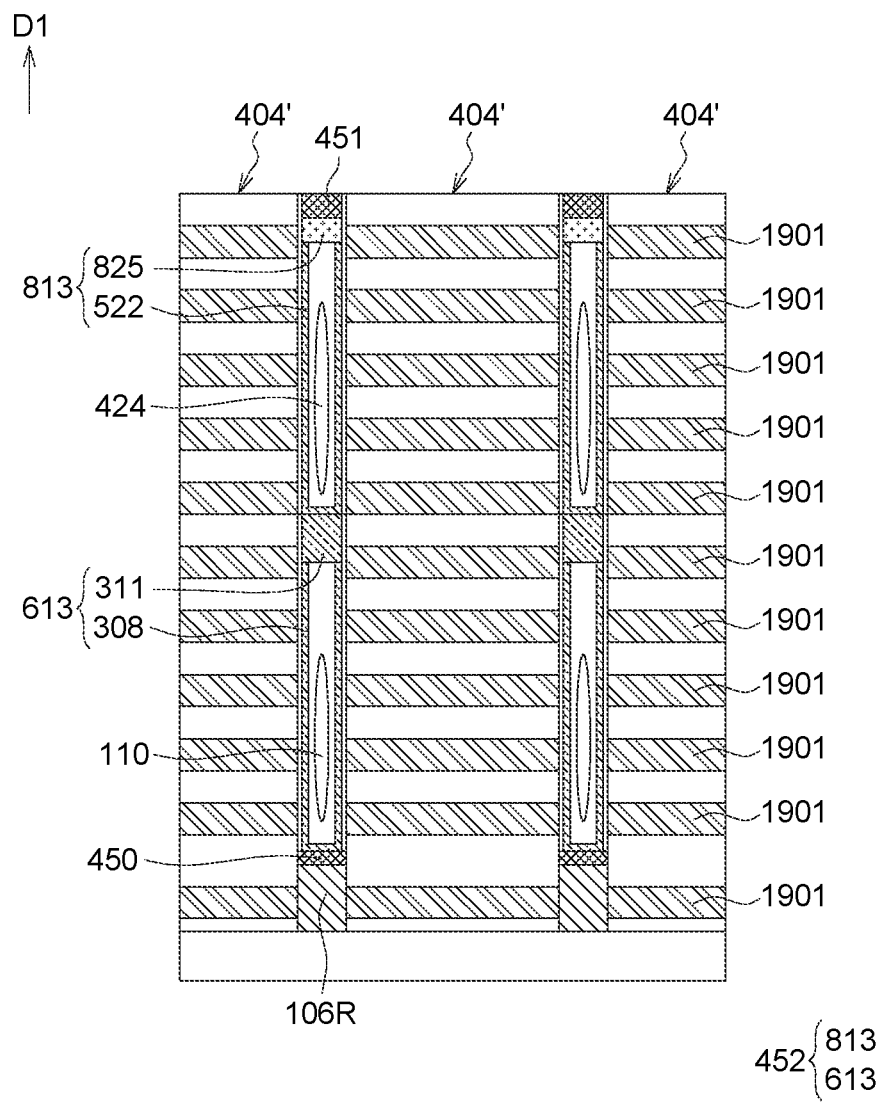

In an embodiment, after the method schematically illustrated in FIGS. 12-18, a gate replacement process may be performed to the semiconductor structure 20 so as to replace the second patterned insulating layers 103' and the fourth patterned insulating layers 403' with the conductive layers 1901, as shown in FIG. 19. The conductive layers 1901 may be functioned as a gate structure of the semiconductor structure. The conductive layers 1901 may include tungsten (W).

As shown in FIGS. 17-19, the semiconductor structure 20 includes two vertical Si channel layers stacked along the direction D1 (the third vertical Si channel layer 813 and the first vertical Si channel layer 613, or the third vertical Si channel layer 713 and the first vertical Si channel layer 613). The present disclosure is not limited thereto. The present disclosure can be applied to the semiconductor structure including several vertical Si channel layers (for example, two or more vertical Si channel layers) stacked along the direction D1. In an embodiment, the present disclosure can be applied to the semiconductor structure including 2×N vertical Si channel layers stacked along the direction D1, and N is one of a positive integer greater than or equal to 1.

When N=1, the semiconductor structure includes two (i.e. 2×1) vertical Si channel layers stacked along the direction D1, the manufacturing method and the resulting semiconductor structure are shown in FIGS. 12-19.

When N is one of a positive integer greater than or equal to 2, the semiconductor structure includes 2×N vertical Si channel layers. The method for manufacturing the semiconductor structure may include: forming 2×N vertical Si channel layers, wherein the 2×N vertical Si channel layers include a $(2 \times n)-1^{th}$ vertical Si channel layer and a $2 \times n^{th}$ vertical Si channel layer disposed from bottom to top (along the direction D1), and n are positive integers ranging from 1 to N; forming N silicide layers (i.e. a plurality of the silicide layers), wherein the N silicide layers are formed between the $(2 \times n)-1^{th}$ vertical Si channel layer and the $2 \times n^{th}$ vertical Si channel layer respectively; then applying an annealing step to the semiconductor structure. During the annealing step, a portion of one of the N silicide layers moves to a bottom of the $1^{st}$ vertical Si channel layer, a portion of another one of the N silicide layers moves to a top of the $2 \times n^{th}$ vertical Si channel layer, and the remainder of the N silicide layers move to locations between the $2 \times n^{th}$ vertical Si channel layer and the $[2 \times (n+1)]-1^{th}$ vertical Si channel layer respectively. The method will become better understood with regard to the following description and FIGS. 20-21.

Figure 20:
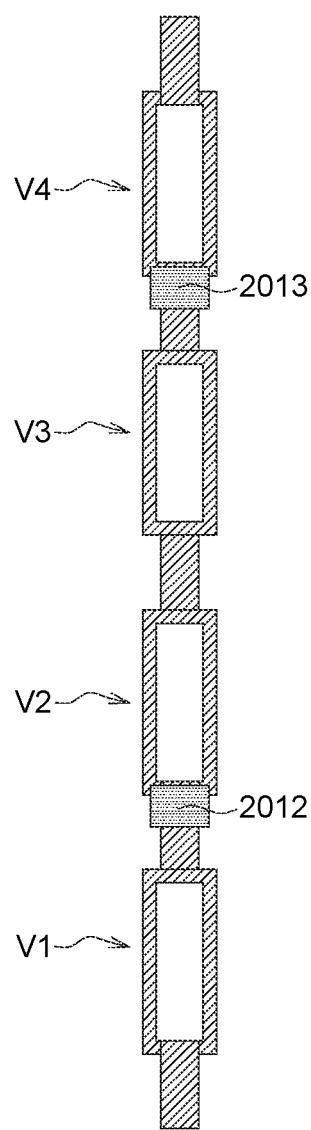
FIGS. 20-21 schematically illustrate a method for manufacturing a semiconductor structure according to yet another embodiment of the present disclosure.
Figure 21:
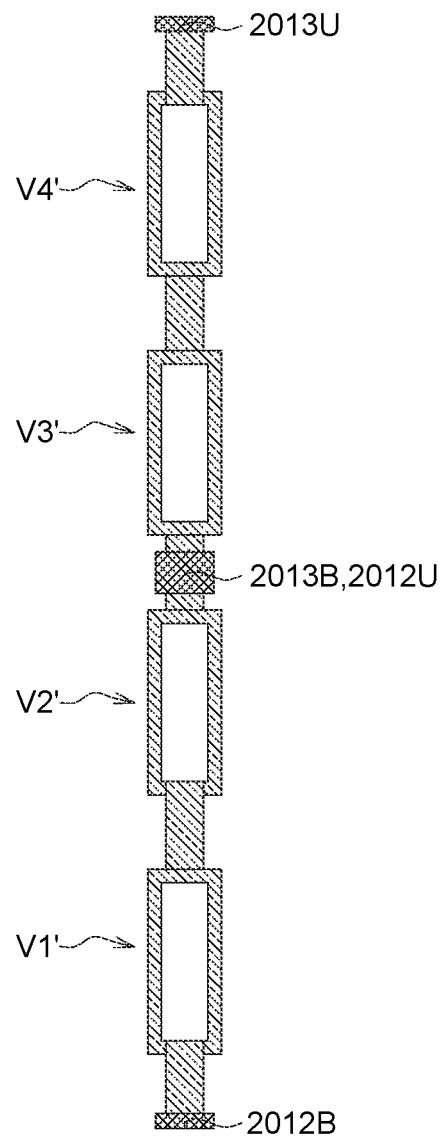

FIGS. 20-21 schematically illustrate a method for manufacturing a semiconductor structure according to yet another embodiment of the present disclosure. In this embodiment, N=2, and n are positive integers ranging from 1 to 2.

Referring to FIG. 20, the method may include forming four (i.e. 2×2) vertical Si channel layers V1-V4 and two silicide layers 2012 and 2013. Four vertical Si channel layers V1-V4 include a $1^{st}$ vertical Si channel layer V1, a $2^{nd}$ vertical Si channel layer V2, $3^{rd}$ vertical Si channel layer V3 and $4^{th}$ (i.e. $2 \times N^{th}$, or may be referred to as $2 \times n^{th}$, n=N=2) vertical Si channel layer V4 from bottom to top along the direction D1. The vertical Si channel layers V1-V4 may be similar to the first vertical Si channel layer 413 and/or the third vertical Si channel layer 513. The silicide layers 2012 and 2013 may be defined as a $1^{st}$ silicide layer 2012 and a $2^{nd}$ (i.e. $N^{th}$) silicide layer 2013 from bottom to top. The silicide layer 2012 is formed between the $1^{st}$ vertical Si channel layer V1 and the $2^{nd}$ vertical Si channel layer V2. The silicide layer 2013 is formed between the $3^{rd}$ vertical Si channel layer V3 and the $4^{th}$ vertical Si channel layer V4. The silicide layers 2012 and 2013 may be similar to the silicide layers 112 and 412. Forming the vertical Si channel layers V1-V4 and the silicide layers 2012 and 2013 may include: firstly, forming the vertical Si channel layer V1 on a substrate (not shown), secondly, forming the silicide layer 2012 on the vertical Si channel layer V1; afterwards forming the vertical Si channel layer V2, the vertical Si channel layer V3, the silicide layer 2013 and the vertical Si channel layer V4 on the silicide layer 2012 in sequence. FIG. 20 merely shows the vertical Si channel layers V1-V4 and the silicide layers 2012 and 2013 of the semiconductor structure, however, the semiconductor structure may further include other elements, such as a patterned stack structure, where the vertical Si channel layers V1-V4 are formed. The patterned stack structure may be similar to the patterned stack structures 104' and 404' shown in FIG. 14.

Then, an annealing step is performed to the semiconductor structure shown in FIG. 20 to change the vertical Si channel layers V1-V4 having a solid phase of a first silicon phase respectively into the vertical Si channel layers V1'-V4' having a solid phase of a second silicon phase. The first silicon phase of the vertical Si channel layers V1-V4 includes amorphous silicon phase or polysilicon phase. The second silicon phase of the vertical Si channel layers V1'-V4' includes single-crystal-like silicon phase or single-crystal silicon phase. During the annealing step, a portion of one of the silicide layers 2012 and 2013 (i.e. a portion of the silicide layer 2012) moves downward to a bottom of the $1^{st}$ vertical Si channel layer V1 (i.e. the $(2 \times n)-1^{th}$ vertical Si channel layer, n=1), and a portion of another one of the silicide layers 2012 and 2013 (i.e. a portion of the silicide layer 2013) moves upward to a top of the $4^{th}$ vertical Si channel layer V4 (i.e. the $2 \times N^{th}$ vertical Si channel layer, or may be understood as the $2 \times n^{th}$ vertical Si channel layer, n=N=2). The remainder of the silicide layer 2012 (i.e. a portion of the silicide layer 2012 which doesn't move downward) moves to a location between the $2^{nd}$ vertical Si channel layer V2 (i.e. the $2 \times n^{th}$ vertical Si channel layer, n=1) and the $3^{rd}$ vertical Si channel layer V3 (i.e. the $[2 \times (n+1)]-1^{th}$ vertical Si channel layer, n=1). The remainder of the silicide layer 2013 (i.e. a portion of the silicide layer 2013 which doesn't move upward) moves to a location between the $2^{nd}$ vertical Si channel layer V2 (i.e. the $2 \times n^{th}$ vertical Si channel layer, n=1) and the $3^{rd}$ vertical Si channel layer V3 (i.e. the $[2 \times (n+1)]-1^{th}$ vertical Si channel layer, n=1). For example, the annealing step may be performed at a temperature of about 450-550° C. for several hours.

The portion of the silicide layer 2012 which moves upward can be defined as a second silicide element, and the remainder of the silicide layer 2012 (the portion of the silicide layer 2012 which moves downward) can be defined as a first silicide element. The portion of the silicide layer 2013 which moves upward can be defined as a second silicide element, and the remainder of the silicide layer 2013 (the portion of the silicide layer 2013 which moves downward) can be defined as a first silicide element.

After the previous annealing step is performed, another annealing step, similar to the steps shown in FIGS. 16-17, can be performed to the semiconductor structure. During this annealing step, the second silicide elements react to form upper silicide elements 2012U and 2013U, and the first silicide elements react to form lower silicide elements 2012B and 2013B. For example, the annealing step may be performed at a temperature of about 600-800° C. for about 30-90 seconds. As shown in FIG. 21, one of the upper silicide elements 2012U and 2013U (i.e. the upper silicide element 2013U formed through the second silicide element from the silicide layer 2013) is at a top of the $4^{th}$ vertical Si channel layer V4' (i.e. the $2 \times N^{th}$ vertical Si channel layer); one of the lower silicide elements 2012B and 2013B (i.e. the lower silicide element 2012B formed through the first silicide element from the silicide layer 2012) is at a bottom of the $1^{st}$ vertical Si channel layer V1'. The remainder of the lower silicide elements 2012B and 2013B and the upper silicide elements 2012U and 2013U (i.e. the lower silicide element 2013B and the upper silicide element 2012U) are disposed between the $2^{nd}$ vertical Si channel layer V2' (i.e. the $2 \times n^{th}$ vertical Si channel layer) and the $3^{rd}$ vertical Si channel layer V3' (i.e. the $[2 \times (n+1)]-1^{th}$ vertical Si channel layer). The upper silicide elements 2012U and 2013U may be similar to the upper silicide element 451. The lower silicide elements 2012B and 2013B may be similar to the lower silicide element 450.

Through the method schematically illustrated in FIGS. 20-21, a semiconductor structure 30 is provided. The semiconductor structure 30 includes two vertical Si channel structures (i.e. N vertical Si channel structures: N=2 in this embodiment). Two vertical Si channel structures comprise a $1^{st}$ vertical Si channel structure (i.e. a $n^{th}$ vertical Si channel structure, n=1) and a $2^{nd}$ vertical Si channel structure (i.e. a $n^{th}$ vertical Si channel structure, n=2) disposed from bottom to top. The $1^{st}$ vertical Si channel structure includes the $1^{st}$ vertical Si channel layer V1' (i.e. the $(2 \times n)-1^{th}$ vertical Si channel layer, n=1) and the $2^{nd}$ vertical Si channel layer V2' (i.e. the $2 \times n^{th}$ vertical Si channel layer, n=1). The $2^{nd}$ vertical Si channel structure includes the $3^{rd}$ vertical Si channel layer V3' (i.e. the $(2 \times n)-1^{th}$ vertical Si channel layer, n=2) and the $4^{th}$ vertical Si channel layer V4' (i.e. the $2 \times n^{th}$ vertical Si channel layer, n=2). The semiconductor structure 30 further includes the lower silicide elements 2012B and 2013B and the upper silicide elements 2012U and 2013U. The lower silicide element 2012B is at a bottom of the $1^{st}$ vertical Si channel layer V1', and the upper silicide element 2013U is at a top of the $4^{th}$ vertical Si channel layer V4' (i.e. the $2 \times N^{th}$ vertical Si channel layer). The lower silicide element 2013B and the upper silicide element 2012U) are disposed between the $2^{nd}$ vertical Si channel layer V2' (i.e. the $2 \times n^{th}$ vertical Si channel layer) and the $3^{rd}$ vertical Si channel layer V3' (i.e. the $[2 \times (n+1)]-1^{th}$ vertical Si channel layer) respectively.

The present disclosure provides a semiconductor structure with the channel structure including single-crystal-like silicon, the electrical performance of the semiconductor structure can be improved. In addition, the upper silicide element and the lower silicide element include di-silicon silicide portions, and the electrical performance of the semiconductor structure can be further improved.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broad-

What is claimed is:

1. A method for manufacturing a semiconductor structure, comprising:
   forming a silicide layer;
   forming a vertical Si channel layer, wherein the vertical Si channel layer is on an upper surface of the silicide layer, the vertical Si channel layer has a first silicon phase; and
   performing a first annealing step so as to move the silicide layer upward and change a solid phase of the vertical Si channel layer from the first silicon phase to a second silicon phase at an interface of the silicide layer and the vertical Si channel layer, wherein the second silicon phase has a conductivity higher than a conductivity of the first silicon phase.

2. The method according to claim 1, further comprising:
   forming another vertical Si channel layer having the first silicon phase, wherein the silicide layer is formed on an upper surface of the another vertical Si channel layer.

3. The method according to claim 2, wherein during the first annealing step, the silicide layer is divided into a first silicide element and a second silicide element, the first silicide element moves downward, the second silicide element moves upward.

4. The method according to claim 3, further comprising forming a semiconductor element, wherein the another vertical Si channel layer is formed on the semiconductor element, the first silicide element stops moving on the semiconductor element.

5. The method according to claim 4, further comprising performing a second annealing step to form a lower silicide element through a reaction of the first silicide element with the semiconductor element.

6. The method according to claim 5, wherein first silicide element comprises mono-silicon silicide, the lower silicide element comprises a di-silicon silicide portion.

7. The method according to claim 3, further comprising:
   forming a polysilicon layer on the second silicide element; and
   performing a second annealing step to form an upper silicide element through a reaction between the second silicide element and the polysilicon layer.

8. The method according to claim 1, wherein the first silicon phase comprises amorphous silicon phase or polysilicon phase, the second silicon phase comprises single-crystal-like silicon phase.

9. The method according to claim 1, comprising:
   forming $2 \times N$ vertical Si channel layers, wherein N is one of a positive integer greater than or equal to 2, the vertical Si channel layers comprise a $(2 \times n)-1^{th}$ vertical Si channel layer and a $2 \times n^{th}$ vertical Si channel layer disposed from bottom to top, n are positive integers ranging from 1 to N;
   forming a plurality of the silicide layers, wherein the silicide layers are formed between the $(2 \times n)-1^{th}$ vertical Si channel layer and the $2 \times n^{th}$ vertical Si channel layer respectively; and
   moving a portion of one of the silicide layers to a bottom of the $1^{st}$ vertical Si channel layer, a portion of another one of the silicide layers to a top of the $2 \times n^{th}$ vertical Si channel layer, and the remainder of the silicide layers to locations between the $2 \times n^{th}$ vertical Si channel layer and the $[2 \times (n+1)]-1^{th}$ vertical Si channel layer respectively through the first annealing step.

10. A semiconductor structure, comprising:
    a lower silicide element;
    an upper silicide element;
    a vertical Si channel structure connected between the lower silicide element and the upper silicide element, wherein the vertical Si channel structure comprises single-crystal-like silicon; and
    an air gap in the vertical Si channel structure,
    wherein the vertical Si channel structure comprises a vertical Si channel layer surrounding the air gap and another vertical Si channel layer on an upper surface of the vertical Si channel layer and under the upper silicide element.

11. The semiconductor structure according to claim 10, wherein the lower silicide element comprises a di-silicon silicide portion.

12. The semiconductor structure according to claim 10, wherein the upper silicide element comprises a di-silicon silicide portion.

13. The semiconductor structure according to claim 10, further comprising a semiconductor element, wherein the lower silicide element connected between the semiconductor element and the vertical Si channel structure.

14. The semiconductor structure according to claim 13, wherein the semiconductor element is under the lower silicide element.

15. The semiconductor structure according to claim 10, wherein the vertical Si channel layer and the another vertical Si channel layer both comprises single-crystal-like silicon.

16. The semiconductor structure according to claim 10, further comprising a stack structure, wherein the lower silicide element, the upper silicide element and the vertical Si channel structure are in the stack structure.

17. The semiconductor structure according to claim 10, wherein the vertical Si channel structure comprises a vertical Si channel film, another vertical Si channel film, and a pad between the vertical Si channel film and the another vertical Si channel film, the vertical Si channel film, the another vertical Si channel film and the pad comprises single-crystal-like silicon.

18. A semiconductor structure according to claim 10, comprising:
    $2 \times N$ vertical Si channel layers, wherein N is one of a positive integer greater than or equal to 2, the vertical Si channel layers comprise a $(2 \times n)-1^{th}$ vertical Si channel layer and a $2 \times n^{th}$ vertical Si channel layer disposed from bottom to top, n are positive integers ranging from 1 to N;
    N vertical Si channel structures, wherein the vertical Si channel structures comprise $n^{th}$ vertical Si channel structures disposed from bottom to top, the $n^{th}$ vertical Si channel structures comprise the $(2 \times n)-1^{th}$ vertical Si channel layer and the $2 \times n^{th}$ vertical Si channel layer, the vertical Si channel structures comprise single-crystal-like silicon; and
    a plurality of lower silicide elements and a plurality of upper silicide elements, wherein one of the lower silicide elements is at a bottom of the $1^{st}$ vertical Si channel layer, one of the upper silicide elements is at a top of the $2 \times n^{th}$ vertical Si channel layer, and the remainder of the lower silicide elements and the upper silicide elements are disposed between the $2 \times n^{th}$ vertical Si channel layer and the $[2 \times (n+1)]-1^{th}$ vertical Si channel layer respectively.

* * * * *